United States Patent
Ikeda

(10) Patent No.: US 7,859,284 B2
(45) Date of Patent: Dec. 28, 2010

(54) SEMICONDUCTOR DEVICE AND SEMICONDUCTOR DEVICE MODULE

(75) Inventor: Shinichiro Ikeda, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 175 days.

(21) Appl. No.: 12/058,241

(22) Filed: Mar. 28, 2008

(65) Prior Publication Data

US 2008/0238469 A1 Oct. 2, 2008

(51) Int. Cl.
*G01R 31/02* (2006.01)

(52) U.S. Cl. .................................... 324/763

(58) Field of Classification Search ................ None
See application file for complete search history.

(56) References Cited

U.S. PATENT DOCUMENTS

| | | | | |
|---|---|---|---|---|
| 6,078,514 A | * | 6/2000 | Takemae et al. | 365/63 |
| 2008/0205170 A1 | * | 8/2008 | Ikeda | 365/193 |
| 2009/0249110 A1 | * | 10/2009 | Takakura et al. | 713/601 |

FOREIGN PATENT DOCUMENTS

JP  2004-247523 A  9/2004

* cited by examiner

*Primary Examiner*—Jermele M Hollington
(74) *Attorney, Agent, or Firm*—Arent Fox, LLP

(57) ABSTRACT

To provide a semiconductor module and a semiconductor device enabling more accurate testing of the connection state of the internal wiring between the semiconductor devices. The semiconductor device has switches SW11 through SW13 that connect a test terminal TT to one end side of wires to be tested, and transistors M21 through M23 that supply a ground potential VSS to the other end side of the wires to be tested. When a power source potential VDD is supplied to one end of the wires to be tested and a ground potential VSS is supplied to the other end of the wires to be tested, a current path can be formed including the wires to be tested. If a power source potential VDD is supplied to the wires to be tested and a ground potential VSS is supplied to the wires which are not to be tested, a difference in potential can be generated between the wires to be tested and the rest of the wires, which makes it possible to detect a short circuit failure.

14 Claims, 8 Drawing Sheets

CIRCUIT CONFIGURATION OF MULTI-CHIP MODULE 1 ACCORDING TO FIRST EMBODIMENT

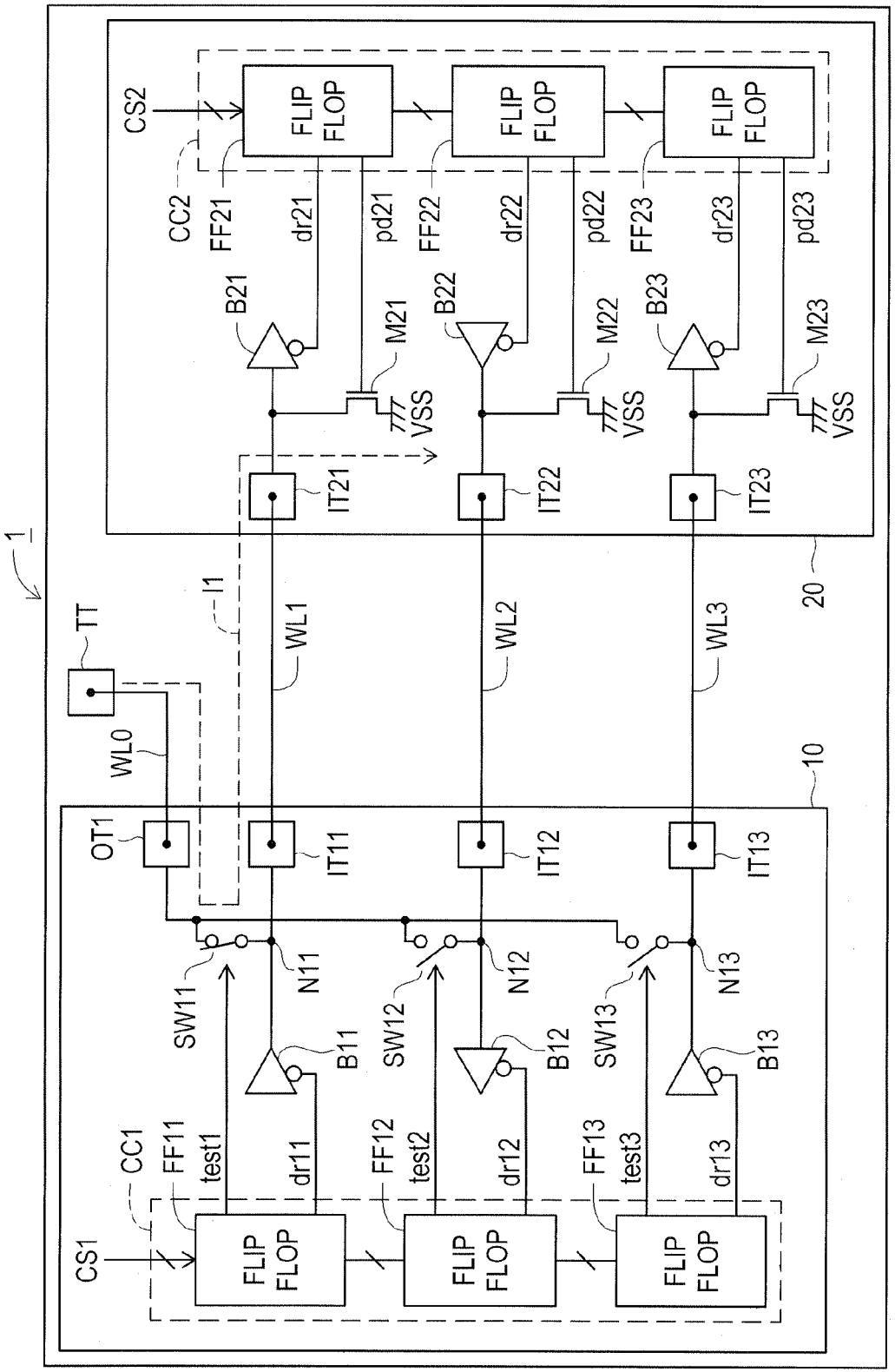
FIG. 1 CIRCUIT CONFIGURATION OF MULTI-CHIP MODULE 1 ACCORDING TO FIRST EMBODIMENT

FIG. 2
TABLE FOR EXPLAINING OPERATION IN OPEN CIRCUIT FAILURE TESTING MODE ACCORDING TO FIRST EMBODIMENT

|  | NON-TESTING MODE | OPEN CIRCUIT FAILURE TESTING MODE | | |
|---|---|---|---|---|
|  |  | TEST IN WIRE WL1 | TEST IN WIRE WL2 | TEST IN WIRE WL3 |
| test1 | OFF | ON | OFF | OFF |
| pd21 | OFF | ON | X | X |
| test2 | OFF | OFF | ON | OFF |
| pd22 | OFF | X | ON | X |
| test3 | OFF | OFF | OFF | ON |
| pd23 | OFF | X | X | ON |

FIG. 3
TABLE FOR EXPLAINING OPERATION IN SHORT CIRCUIT FAILURE TESTING MODE ACCORDING TO FIRST EMBODIMENT

|  | NON-TESTING MODE | SHORT CIRCUIT FAILURE TESTING MODE | | |
|---|---|---|---|---|
|  |  | TEST IN WIRE WL1 | TEST IN WIRE WL2 | TEST IN WIRE WL3 |
| test1 | OFF | ON | OFF | OFF |
| pd21 | OFF | OFF | ON | ON |
| test2 | OFF | OFF | ON | OFF |
| pd22 | OFF | ON | OFF | ON |
| test3 | OFF | OFF | OFF | ON |
| pd23 | OFF | ON | ON | OFF |

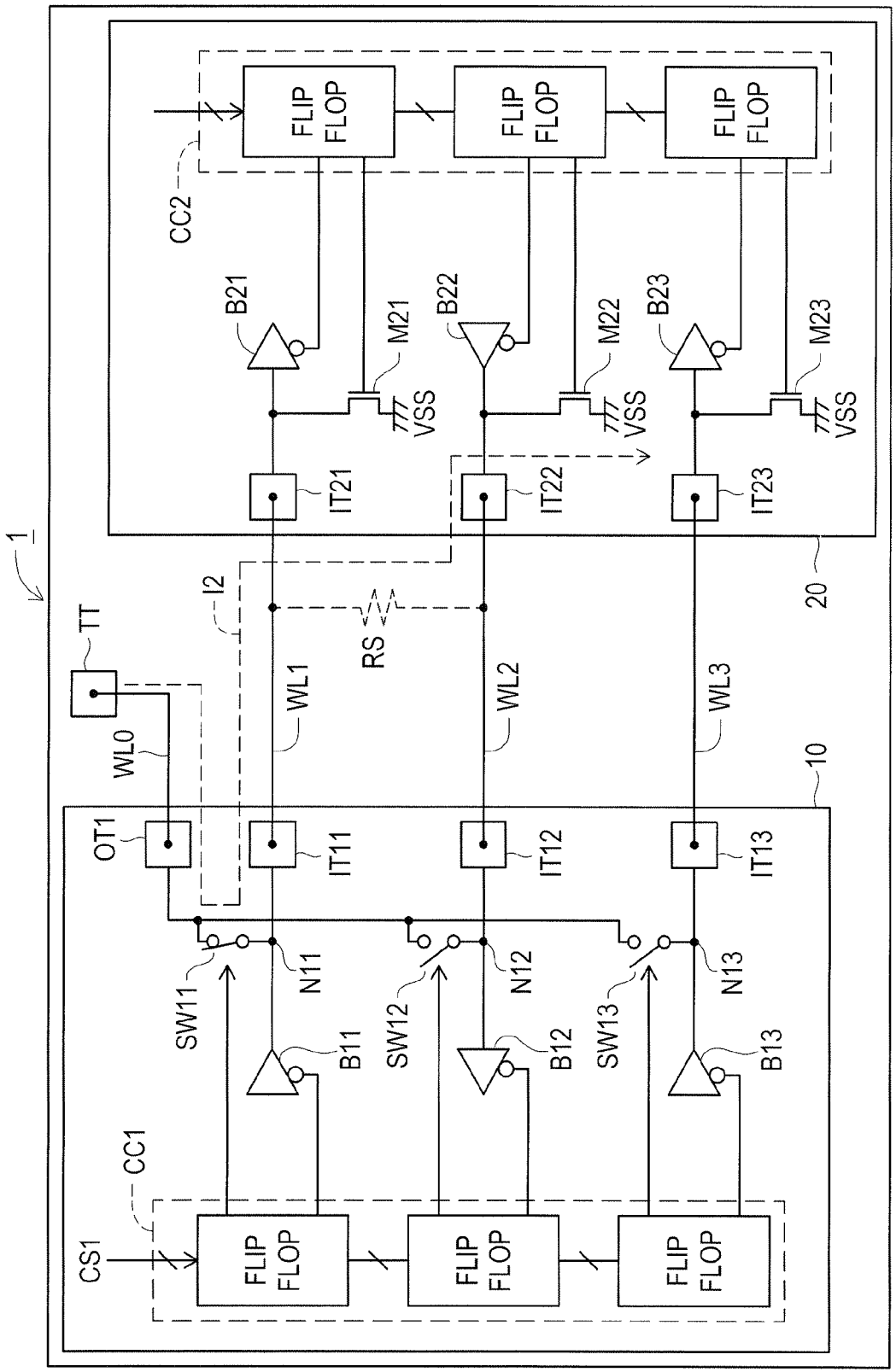
FIG. 4 CURRENT PATH IN THE EVENT OF SHORT CIRCUIT FAILURE

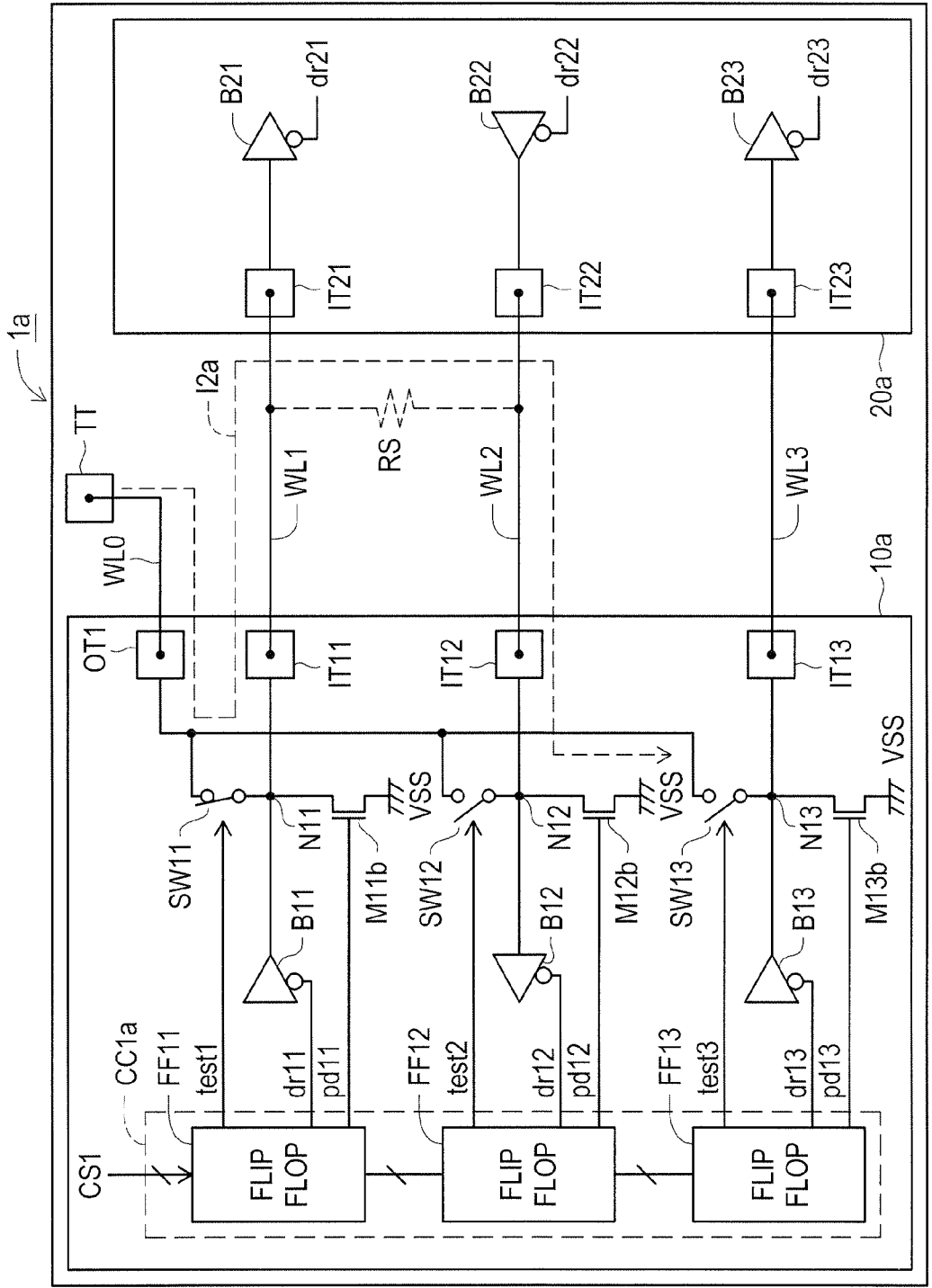
FIG. 5 CIRCUIT CONFIGURATION OF MULTI-CHIP MODULE 1a ACCORDING TO SECOND EMBODIMENT

FIG. 6
TABLE FOR EXPLAINING OPERATION IN SHORT CIRCUIT FAILURE TESTING MODE ACCORDING TO SECOND EMBODIMENT

|  | NON-TESTING MODE | SHORT CIRCUIT FAILURE TESTING MODE | | |
| --- | --- | --- | --- | --- |
|  |  | TEST IN WIRE WL1 | TEST IN WIRE WL2 | TEST IN WIRE WL3 |
| test1<br>pd11 | OFF<br>OFF | ON<br>OFF | OFF<br>ON | OFF<br>ON |
| test2<br>pd12 | OFF<br>OFF | OFF<br>ON | ON<br>OFF | OFF<br>ON |
| test3<br>pd13 | OFF<br>OFF | OFF<br>ON | OFF<br>ON | ON<br>OFF |

FIG. 7 CIRCUIT CONFIGURATION OF SECOND SEMICONDUCTOR DEVICE 20b

FIG. 8 CIRCUIT CONFIGURATION OF SECOND SEMICONDUCTOR DEVICE 20c

BLOCK CIRCUIT DIAGRAM SHOWING CONFIGURATION OF CONVENTIONAL SEMICONDUCTOR DEVICE

US 7,859,284 B2

SEMICONDUCTOR DEVICE AND SEMICONDUCTOR DEVICE MODULE

CROSS-REFERENCE TO RELATED APPLICATIONS

This application is based upon and claims the benefit of priority from the prior Japanese Patent Application No. 2007-088453 filed on Mar. 29, 2007, the entire contents of which are incorporated herein by reference.

BACKGROUND

1. Field

The disclosure relates to a semiconductor device and a semiconductor device module, and in particular, it relates to a semiconductor device and a semiconductor device module enabling more accurate testing of a connection state of the internal wiring in a semiconductor module in which a plurality of semiconductor devices are mounted, and between the semiconductor devices mounted in the semiconductor device module.

2. Description of Related Art

FIG. 9 is a block circuit diagram showing a configuration of a semiconductor device according to Japanese Laid-open Patent Publication No. 2004-247523. In FIG. 9, 101 denotes a semiconductor chip that will serve as a base (hereinafter referred to as master chip), 102 denotes an internal circuit integrated in the master chip 101, 115 denotes a semiconductor chip stacked on the master chip 101 (hereinafter referred to as slave chip), 116 denotes an internal circuit integrated in the slave chip 115, 117 through 120 denote inter-chip connection terminals that deliver signals between the internal circuit 116 and the internal circuit 102 provided on the master chip 101, 121 through 124 denote diodes connected to the inter-chip connection terminals 117 through 120, 125 through 128 denote inter-chip connection terminals that deliver signals between the internal circuit 102 provided on the master chip 101 and the internal circuit 116 provided on the slave chip 115, and 133 through 136 denote wires that connect the inter-chip connection terminals 117 through 120 with the inter-chip connection terminals 125 through 128. Switch elements 201 through 204 are respectively connected in series between the inter-chip connection terminals 125 through 128 and the conductivity test terminal 137a. A switch control section 200 controls the switch elements 201 through 204 so that one switch element at a time becomes conductive at the time of conductivity testing. Line switch elements 205 through 208 are respectively connected in series between the inter-chip connection terminals 125 through 128 and the diodes 129 through 132.

Next, a description will be given on the operation of the semiconductor device of Japanese Laid-open Patent Publication No. 2004-347523 having the configuration described above. A conductivity test terminal 138a sets in advance the line switch elements 205 through 208 to a non-conductive state, thereby blocking the current pathway to diodes 129 through 132. When testing the conductivity of wire 133, the switch control section 200 controls switch 201 alone to become conductive and controls switches 202 through 204 to become non-conductive. The switch control section 200 then applies a potential exceeding a (power source potential (VDD)+a threshold voltage Vt of diode 121) with respect to conductivity test terminal 137a and simultaneously measures the current flowing to the conductivity test terminal 137a. Here, in a normal state in which the wire 133 is not faulty, a current flows in a forward direction with respect to the power source potential (VDD), to the diode 121, so that a determination can be made that wire 133 is conductive. On the other hand, if the current value is 0, it is detected that wire 133 is disconnected. Disconnections in all wires 133 through 136 can be detected by applying the above sequence in turn to each one terminal from all inter-chip connection terminals 125 through 128.

Here, switch elements 201 through 208 are generally provided with a PMOS transistor. However, in the circuit of the Japanese Patent Application Publication No. 2004-347523 shown in FIG. 9, a potential exceeding (a power source potential (VDD)+threshold voltage Vt of the diode 121) is applied to the conductivity test terminal 137a. Thus, since a power source potential VDD is generally employed in the PMOS transistor as a substrate bias potential, a PN junction leak current leaking from the source to the substrate is generated. As a result, a leak current is generated in switch elements 201 through 208 which thus obstructs normal performance of open circuit failure testing. Japanese Laid-open Patent Publication No. 2004-347523 includes no description of a specific method to solve the above problem.

SUMMARY

It is an aspect of the embodiments discussed herein to provide a semiconductor module comprising a plurality of semiconductor devices, the semiconductor module selecting a first semiconductor device and a second semiconductor device connected to each other by internal wires from the plurality of the semiconductor devices mounted therein and testing a connection state of the internal wires, wherein the first semiconductor device comprises: first semiconductor device internal connection terminals which are connected to the second semiconductor device through the internal wires; an external connection terminal which is connected to a terminal of the semiconductor module and is supplied with an external supply potential; and first connection switches which connect to-be-tested first semiconductor device internal connection terminals, selected from the first semiconductor device internal connection terminals, and the external connection terminal, the second semiconductor device comprises: second semiconductor device internal connection terminals which are connected to the first semiconductor device through the internal wires; and second connection switches which supply a reference potential to-be-tested second semiconductor device internal connection terminals connected to the to-be-tested first semiconductor device internal connection terminals through the internal wires when in a first state, and supply the reference potential to all the second semiconductor device internal connection terminals other than the to-be-tested second semiconductor device internal connection terminals when in a second state.

The above and further novel features of the disclosure will more fully appear from the following detailed description when the same is read in connection with the accompanying drawings. It is to be expressly understood, however, that the drawings are for the purpose of illustration only and are not intended as a definition of the limits of the disclosure.

BRIEF DESCRIPTION OF THE DRAWINGS

FIG. 1 is a diagram showing a circuit configuration of a multi-chip module 1 according to a first embodiment;

FIG. 2 is a table for explaining an operation in an open circuit failure testing mode according to a first embodiment;

FIG. 3 is a table for explaining an operation in a short circuit failure testing mode according to a first embodiment;

FIG. 4 is a view showing a current path in the event of a short circuit failure;

FIG. 5 is a diagram showing a circuit configuration of a multi-chip module 1a according to a second embodiment;

FIG. 6 is a table for explaining an operation in a short circuit failure testing mode according to the second embodiment;

DETAILED DESCRIPTION OF THE PREFERRED EMBODIMENTS

Figure 7:
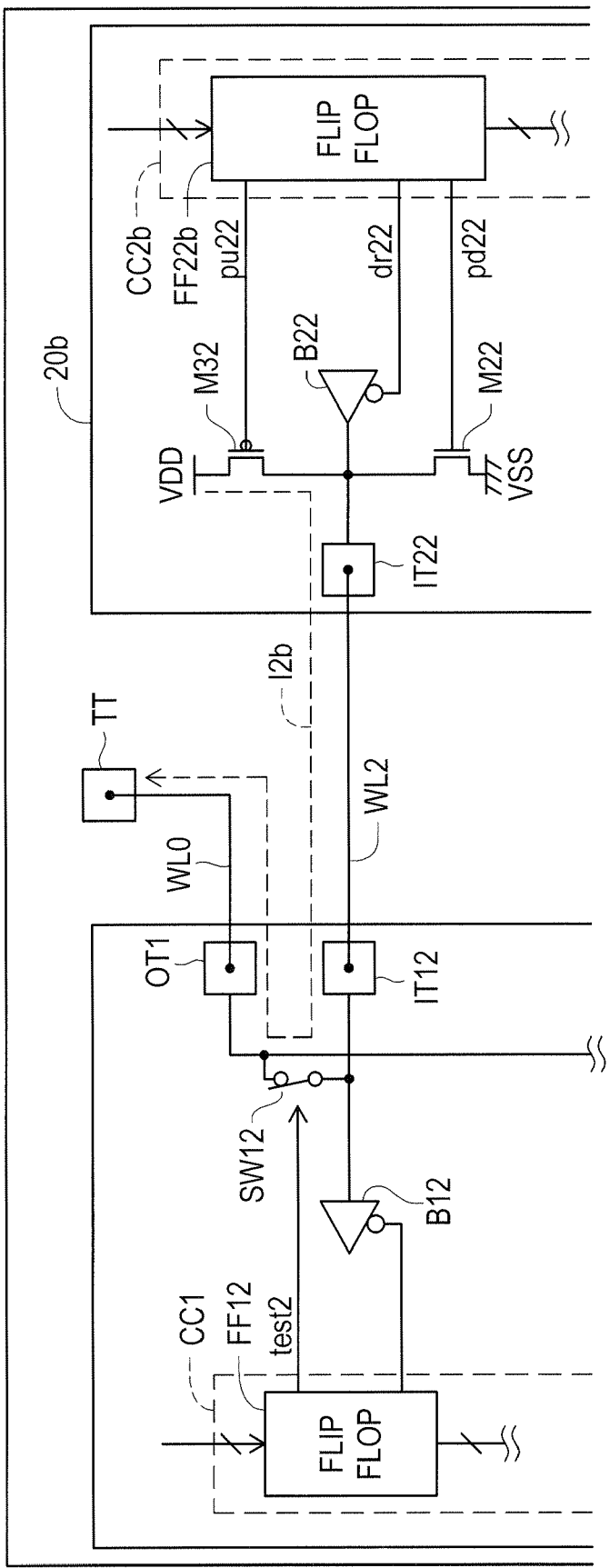
FIG. 7 is a diagram showing a circuit configuration of a second semiconductor device 20b.

A semiconductor module has a plurality of semiconductor devices mounted therein. The semiconductor module according to the disclosure may include a system in package (SIP) for instance. The semiconductor module has a terminal that connects the semiconductor devices mounted therein to the exterior of the semiconductor module. After the semiconductor module has been completed, a connection state of its internal wires is tested. A first semiconductor device and a second semiconductor device connected to each other are selected as test subjects from the plurality of semiconductor devices. The internal wires that connect the first semiconductor device and the second semiconductor device are then tested.

The first semiconductor device has first semiconductor device internal connection terminals, an external connection terminal and first connection switches. The first semiconductor device internal connection terminals are connected to the second semiconductor device through internal wires. The external connection terminal is connected to a terminal of the semiconductor module. An external supply potential is then supplied to the external connection terminal through a terminal of the semiconductor module. The first connection switches connect the to-be-tested first semiconductor device internal connection terminals which were selected as test subjects from the first semiconductor device internal connection terminals, with the external connection terminal.

The second semiconductor device has second semiconductor device internal connection terminals and second connection switches. The second semiconductor device internal connection terminals are connected to the first semiconductor device through internal wires.

The semiconductor module comprises a plurality of semiconductor devices arranged therein. Internal wiring is provided between the semiconductor devices through the internal connection terminals to thus complete the semiconductor module. After the semiconductor module has been completed, open/short circuit failure testing of the internal wiring is carried out. The open/short circuit failure testing is carried out by measuring the value of the current flowing to the external connection terminal using a measuring device such as a tester or the like connected to the external connection terminal.

In a first state, the second connection switches supply a reference potential with respect to the to-be-tested second semiconductor device internal connection terminals that are connected to the to-be-tested first semiconductor device internal connection terminals via internal wiring. A current path is thus formed extending from the external connection terminal, through the to-be-tested first semiconductor device internal connection terminals, internal wiring and the to-be-tested second semiconductor device internal connection terminals and to the reference potential. Thus, if no open circuit failure occurs in the internal wiring connecting the to-be-tested first semiconductor device internal connection terminals with the to-be-tested second semiconductor device internal connection terminal, a current flows in accordance with a difference in potential between the external supply potential and the reference potential. A resistance value showing the extent of the open circuit failure can be measured by measuring the current value using a measuring device connected to the external connection terminal. The measured resistance value allows to determine the presence or absence of an open circuit failure or the extent of an open circuit failure in the internal wiring connected to the to-be-tested internal connection terminals.

In a second state, the second connection switches supply a reference potential to all second semiconductor device internal connection terminals other than the to-be-tested second semiconductor device internal connection terminals. The output buffers and the like connected to the to-be-tested first semiconductor device internal connection terminals and the to-be-tested second semiconductor device internal connection terminals are all in a high impedance state. This is a state in which an external supply potential is applied to the internal wiring (internal wiring to be tested) connected to the to-be-tested second semiconductor device internal connection terminals. On the other hand, this is a state in which a reference potential is applied to the internal wiring (internal wiring which is not the object of testing) which is connected to all second semiconductor device internal connection terminals other than the to-be-tested second semiconductor device internal connection terminals. As a result, a difference in potential is set between the internal wiring which is the object of testing and the rest of the internal wiring which is not the object of testing. If no short circuit failure occurs between the internal wiring which is the object of testing and the rest of the internal wiring which is not the object of testing, a current path is not formed and there is no current flow. On the other hand, if a short circuit failure occurs between the internal wiring which is the object of testing and at least any one internal wiring which is not the object of testing, a current path is formed extending from the exterior connection terminal, through the first connection switches, the to-be-tested first semiconductor device internal connection terminals, the internal wiring in which a short circuit failure occurs and the second semiconductor device internal connection terminals, and to the reference potential, and a current flows therethrough.

A resistance value showing the extent of short circuit failure can be measured by measuring the current value by means of a measuring device connected to the external connection terminal. The measured resistance value allows to determine the presence or absence, or the extent of a short circuit failure in the internal wiring.

Here, the value of the external supply potential is within a range extending from a high-level reference potential to a low-level reference potential to be supplied to the first semiconductor device and second semiconductor device. It is thus possible to prevent a difference in potential that may occur when a PN junction leak current is generated between the source/drain in the MOS transistors provided in the first connection switches and the second connection switches, and the substrate. This allows for the switching operation of the first connection switches and the second connection switches to be reliably carried out. The accuracy of the open/short circuit failure testing can be improved by preventing an unnecessary leak current from being generated.

A resistance value showing the extent of the open/short-circuit failure can be measured by measuring a current value of the current flowing to the external connection terminal in the open/short-circuit failure testing operation. This makes it possible to detect even failures including an open circuit failure in the extent that a high resistance state exists but a signal can still be propagated, or a short circuit failure in the extent that a low resistance state exists but the signal can still be propagated. The semiconductor module can thus be tested with a high degree of reliability. Since a variation in the resistance value can be measured before and after stress application such as burn-in testing and the like, a reliability acceleration test can be performed. Accordingly, the reliability of the semiconductor module can be further improved.

A first embodiment of a multi-chip module 1 according to the disclosure will now be described while referring to FIG. 1 through FIG. 4. FIG. 1 is a diagram showing a circuit configuration of a multi-chip module according to the first embodiment. The multi-chip module 1 may include a system in package (SIP), for instance. The multi-chip module 1 has a first semiconductor device 10, a second semiconductor device 20 and a test terminal TT.

The first semiconductor device 10 has an external connection terminal OT1, internal connection terminals IT11 through IT13, switches SW11 through SW13, buffers B11 through B13 and a control circuit CC1. The external connection terminal OT1 is coupled to the test terminal TT by wire WL0. In turn, the test terminal TT is connected to an external measuring device (tester or the like) not shown. Switch SW11 is commonly connected to an output terminal of buffer B11 and to the internal connection terminal IT11 through a node N11.

The control circuit CC1 serves as a shift register and is constituted of flip flops FF11 through FF13 connected in series. The flip flop FF11 receives a control signal CS1 from an internal circuit not shown. The control signal CS1 is constituted of a signal test for controlling switches SW11 through SW13, and a signal dr for controlling buffers B11 through B13. A signal test1 outputted from the flip flop FF11 provided in the control circuit CC1 is inputted to switch SW11, and a signal dr11 is inputted to buffer B11. The flip flops FF12 and FF13 have the same configuration as flip flop FF11 and therefore, further description thereof is hereby omitted.

The second semiconductor device 20 has internal connection terminals IT21 through IT23, buffers B21 through B23, transistors M21 through M23 and a control circuit CC2. The internal connection terminals IT11 through IT13 of the first semiconductor device 10 and the internal connection terminals IT21 through IT23 of the second semiconductor device 20 are respectively coupled through wires WL1 through WL3. The internal connection terminals IT21 through IT23 are respectively connected to buffers B21 through B23. The input terminal of buffer B21 is commonly connected to internal connection terminal IT21 and one end side of the transistor M21. A ground potential VSS is supplied to the other end side of the transistor M21.

The control circuit CC2 is a shift register consisting of flip flops FF21 through FF23 connected in series. The flip flop FF21 receives a control signal CS2 from an internal circuit not shown. The control signal CS2 consists of a signal pd for controlling the transistors M21 through M23 and a signal dr for controlling buffers B21 through B23. A signal pd21 outputted from the flip flop FF21 provided in the control circuit CC2 is inputted to the transistor M21 and a signal dr21 is inputted to buffer B21. Flip flops FF22 and FF23 have the same configuration as flip flop FF21, and therefore further description thereof is hereby omitted.

An operation of the multi-chip module 1 will now be described using the table in FIG. 2. The multi-chip module 1 has a non-testing mode for normal operation, an open circuit failure testing mode for testing an open circuit failure in the wires WL1 through WL3, and a short circuit failure testing mode for testing a short circuit failure in the wires WL1 through WL3.

During normal operation, the multi-chip module 1 is in a non-testing mode. In the non-testing mode, signals dr11 through dr13 are ON and buffers B11 through B13 are all in an output enable state. At the same time, signals dr21 through dr23 are ON and buffers B21 through B23 are all in an output enable state. As shown in FIG. 2, in the non-testing mode, signals test1 through test3 are all OFF, so that switches SW11 through SW13 are in a non-conductive state. Further, as shown in the same table, signals pd21 through pd23 are all OFF, so that transistors M21 through M23 are all in a non-conductive state. Since buffers B11 through B13 of the first semiconductor device 10 are respectively connected to the buffers B21 through B23 of the second semiconductor device 20, with each of these buffers being in an output enable state, operation is carried out normally.

Next, the operation for open circuit failure testing and short circuit failure testing will be described. During these failure testing operations, the multi-chip module 1 is set to a testing mode by a control signal or the like sent from an external measuring device such as a tester or the like. A power source potential VDD is supplied to the test terminal TT during the failure testing operation. The power source potential VDD supplied to the test terminal TT at this time is made equal to the power source potential VDD supplied to the first semiconductor device 10 and the second semiconductor device 20. Also, signals dr11 through dr13 are OFF so that the output terminals of buffers B11 through B13 are in a high impedance state. At the same time, signals dr21 through dr23 are OFF so that the output terminals of buffers B21 through B23 are in a high impedance state.

The open circuit failure testing mode will be described next. In the open circuit failure testing mode, the presence or absence of an open circuit failure in the wires WL1 through WL3 is sequentially tested. First, the open circuit failure testing of wire WL1 will be described. As shown in the table of FIG. 2, a signal test1=ON is outputted by the flip flop FF11 inside the control circuit CC1, so that the switch SW11 is made conductive and the internal connection terminal IT11 is connected to the external connection terminal OT1. Also, a signal pd21=ON is outputted by the flip flop FF21 provided in the control circuit CC2, so that the transistor M21 is made conductive and a ground potential VSS is supplied to the internal connection terminal IT21. Thus, as shown in FIG. 1, a current path is formed extending from the test terminal TT, through wire WL0, the external connection terminal OT1, switch SW11, internal connection terminal IT11, wire WL1, internal connection terminal IT21 and transistor M21 and to the ground potential VSS. A current I1 flowing from the test terminal TT to the transistor M21 is then generated.

Then, a measuring device not shown which is connected to the test terminal TT compares the current value of current I1 to a predetermined threshold current value set in advance to determine the presence or absence of an open circuit failure. If the current value of current I1 is higher than the threshold current value, it is determined that an open circuit failure does not occur. If the current value of current I1 is smaller than the threshold current value, it is determined that an open circuit failure occurs in the extent that wire WL1 is about to brake, and a high resistance state exists but signal propagation is still possible. If no current I1 is measured, it is determined that an open circuit failure occurs.

During the open circuit failure testing operation of the wire WL1, wires WL2 and WL3 are severed from the path of current I1. Accordingly, any potential may be applied to wires WL2 and WL3. Thus, transistors M22 and M23 may be either in a conductive state or anon-conductive state, so that the signals pd22 and pd23 may be in an indefinite state X as well, as shown in FIG. 2.

With the testing of the wire WL1 completed, the output signal is shifted in the control circuit CC1, and the operation flow moves to testing of wire WL2. As shown in the table of FIG. 2, a signal test2=ON is outputted from the flip flop FF12, so that the switch SW12 is made conductive and the internal connection terminal IT12 is connected to the external connection terminal OT1. Also, a signal pd22=ON is outputted from flip flop FF22, so that the transistor M22 is made conductive and a ground potential VSS is supplied to the internal connection terminal IT22. Accordingly, a current path is formed extending from the test terminal TT, through the internal connection terminal IT12, wire WL2, internal connection terminal IT22 and to ground potential VSS. As was already described in the above text, a measuring device not shown compares the value of the current flowing through the current path to a threshold current value to determine the presence or absence of an open circuit failure. Open circuit failure testing of the wire WL3 is carried out in the same manner as the testing of wire WL1, and therefore, further description thereof is hereby omitted.

Next, the short circuit failure testing mode will be described. In the short circuit failure testing mode, the presence or absence of short circuit failure in wires WL1 through WL3 is sequentially tested. First, the short circuit failure testing of wire WL1 will be described. As shown in FIG. 3, signals test1=ON, test2=OFF, test3=OFF are outputted by the control circuit CC1. Thus, the switch SW11 is made conductive, switches SW12 and SW13 are made non-conductive and only the internal connection terminal IT11 is connected to the external connection terminal OT1. A power source potential VDD is then applied from the exterior to wire WL1 through the test terminal TT and the internal connection terminal IT11. Also, signals pd21=OFF, pd22=ON, pd23=ON are outputted from the control circuit CC2 provided in the second semiconductor device 20. The transistor M21 is thus made non-conductive and transistors M22 and M23 are made conductive. As a result, a ground potential VSS is applied to wires WL2 and WL3.

A power source potential VDD is supplied to wire WL1 and a ground potential VSS is supplied to wires WL2 and WL3, which results in a difference in potential between wire WL1 and wires WL2 and WL3. Then, a measuring device not shown which is connected to the test terminal TT measures the current value.

As shown in FIG. 4, if a short circuit failure shown by an equivalent resistance RS occurs between wires WL1 and WL2, a current path is formed extending from the test terminal TT, through wire WL0, external connection terminal OT1, switch SW11, internal connection terminal IT11, wire WL1, equivalent resistance RS, wire WL2, internal connection terminal IT22, transistor M22 and to the ground potential VSS. A current I2 flowing from the test terminal TT to the transistor M22 is thus generated. If the current value of current I2 is smaller than a threshold current value, it is determined that a short circuit failure occurs in the extent that wires WL1 and WL2 are about to short circuit, but signal propagation is still possible. If the current value of current I2 is larger than the threshold current value, it is determined that a short circuit failure occurs. On the other hand, if no current I2 is measured, it is determined that a short circuit failure does not occur.

With the testing of wire WL1 completed, control signals CS1 and CS2 are respectively shifted in control circuits CC1 and CC2 to test short circuit failure of wire WL2. As shown in FIG. 3, signals test1=OFF, test2=ON and test3=OFF are outputted from the control circuit CC1. The switch SW12 is thus made conductive, switches SW11 and SW13 are made non-conductive, and only the internal connection terminal IT12 is connected to the external connection terminal OT1. Also, signals pd21=ON, pd22=OFF and pd23=ON are outputted from control circuit CC2. Accordingly, the transistor M22 is made non-conductive and transistors M21 and M23 are made conductive. A power source potential VDD is supplied to wire WL2 and a ground potential VSS is supplied to wires WL1 and WL3, which results in a difference in potential between wire WL2 and wires WL1 and WL3. Then, as described in the above text, a measuring device not shown connected to the test terminal TT measures the current value to determine the presence or absence of a short circuit failure. The short circuit failure testing of wire WL3 is the same as the testing of wire WL1, and therefore further description thereof is hereby omitted.

In the open circuit failure testing mode and short circuit failure testing mode, the value of the power source potential VDD supplied to the test terminal TT is made equivalent to the power source potential VDD supplied to the first semiconductor device 10 and the second semiconductor device 20. This makes it possible to prevent a difference in potential occurring when a PN junction leak current is generated between the source/drain and the substrate, in the MOS transistor provided in switches SW11 through SW13 and transistors M21 through M23. A switching operation of switches SW11 through SW13 and transistors M21 through M23 can thus be reliably carried out. By preventing an unnecessary leak current from being generated, the accuracy of the open/short circuit failure testing can further be improved.

The multi-chip module 1 described in the first embodiment has switches SW11 through SW13 for connecting the test terminal TT to one end side of the wires to be tested, and transistors M21 through M23 for supplying a ground potential VSS to the other end side of the wires to be tested. As a power source potential VDD is applied to one end of the wires to be tested, and a ground potential VSS is supplied to the other end of the wires to be tested, a current path can be formed including the wires to be tested. This allows for detection of an open circuit failure. On the other hand, if a power source potential VDD is supplied to the wires to be tested and a ground potential VSS is supplied to the wires which are not to be tested, a difference in potential can be generated between the wires to be tested and the rest of the wires. As a result, a short circuit failure can be detected. As can be understood from the above, both open circuit failure and short circuit failure testing can be carried out through one test terminal TT in the multi-chip module 1. The number of terminals in the multi-chip module 1 can this be reduced. This leads to a more compact sized multi-chip module 1 and smaller costs associated therewith.

By preventing a leak current from being generated in the transistor of the circuit to be used in failure testing, the presence or absence of an open circuit failure or short circuit failure can be tested more accurately in the multi-chip module 1 according to the first embodiment.

By measuring the current value of the current flowing to the external connection terminal, it is possible to measure a resistance value showing the extent of open/short circuit failure.

This makes it possible to detect even failures including an open circuit failure in the extent that a high resistance state exists but signal propagation is still possible, or a short circuit failure in the extent that signal propagation is still possible. Thus, the accuracy of the open circuit failure/short circuit failure detection can be improved as compared to the case in which detection is made based on two values of whether logical propagation was possible or impossible. Since a variation in the resistance value can be measured before and after stress application such as burn-in testing and the like, a reliability acceleration test can be performed. Accordingly, the reliability of the semiconductor module can be further improved. The semiconductor module can thus be tested with a high level of reliability required for semiconductors to be used for vehicles or medical purposes.

A second embodiment directed to a first semiconductor device 10a according to the disclosure will now be described with reference to FIG. 5 and FIG. 6. FIG. 5 shows a circuit configuration diagram of a multi-chip module 1a according to the second embodiment. The multi-chip module 1a has a first semiconductor device 10a, a second semiconductor device 20a and a test terminal TT. The first semiconductor device 10a further has transistors M11b through M13b, as compared to the first semiconductor device 10 of the first embodiment. Transistors M11b through M13b are connected between nodes N11 through N13 and the ground potential VSS. Signals pd11 through pd13 outputted from the control circuit CC1a are respectively inputted to the gate terminals of transistors M11b through M13b.

The second semiconductor device 20a has internal connection terminals IT21 through IT23 and buffers B21 through B23. Internal connection terminals IT11 through IT13 and internal connection terminals IT21 through IT23 are respectively coupled through wires WL1 through WL3. Internal connection terminals IT21 through IT23 are respectively connected to buffers B21 through B23. Buffers B21 through B23 respectively receive signals dr21 through dr23. The remaining circuit configuration is the same as that in the multi-chip module 1 in the first embodiment, and therefore further description thereof is hereby omitted.

An operation of the multi-chip module 1a will next be described using the table of FIG. 6. The multi-chip module 1a has a non-testing mode for normal operation, and a short circuit failure testing mode for testing short circuit failures in wires WL1 through WL3.

During the normal operation, the multi-chip module 1 is in the non-testing mode. In the non-testing mode, buffers B11 through B13 and buffers B21 through B23 are all in an output enable state. As shown in FIG. 6, in the non-testing mode, signals test1 through test3 are all OFF, so that switches SW11 through SW13 are made non-conductive. Also, signals pd11 through pd13 are all OFF, so that transistors M11b through M13b are made non-conductive. Since buffers B11 through B13 of the first semiconductor device 10a are respectively connected to the buffers B21 through B23 of the second semiconductor device 20a with each of these buffers being in an output enable state, operation is carried out normally.

Next, the operation for short circuit failure testing will be described. During this failure testing operation, the multi-chip module 1 is set to a testing mode by a control signal or the like sent from an external measuring device such as a tester or the like. Signals dr11 through dr13 are OFF so that the output terminals of buffers B11 through B13 are in a high impedance state. At the same time, signals dr21 through dr23 are OFF so that the output terminals of buffers B21 through B23 are in a high impedance state.

Next, the short circuit failure testing operation of wire WL1 will be described. As shown in FIG. 6, signals test1=ON, test2=OFF and test3=OFF are outputted by the control circuit CC1a. Thus, the switch SW11 is made conductive, switches SW12 and S13 are made non-conductive and only the internal connection terminal IT11 is connected to the external connection terminal OT1. A power source potential VDD is then applied from the exterior to wire WL1 through the test terminal TT and the internal connection terminal IT11. Also, signals pd11=OFF, pd12=ON and pd13=ON are outputted from the control circuit CC1a. The transistor M11b is thus made non-conductive and transistors M12b and M13b are made conductive. As a result, a ground potential VSS is supplied to wires WL2 and WL3.

A power source potential VDD is supplied to wire WL1 and a ground potential VSS is supplied to wires WL2 and WL3, which results in a difference in potential between wire WL1 and wires WL2 and WL3. Then, a measuring device not shown which is connected to the test terminal TT measures the current value.

As shown in FIG. 5, if a short circuit failure shown by an equivalent resistance RS occurs between wires WL1 and WL2, a current path is formed extending from the test terminal TT, through wire WL0, external connection terminal OT1, switch SW11, internal connection terminal IT11, wire WL1, equivalent resistance RS, wire WL2, internal connection terminal IT12, transistor M12b and to the ground potential VSS. A current I2a flowing from the test terminal TT to the transistor M12b is thus generated. If the current value of current I2a is smaller than a threshold current value, it is determined that a short circuit failure occurs in the extent that wires WL1 and WL2 are about to short circuit, but signal propagation is still possible. If the current value of current I2a is larger than the threshold current value, it is determined that a short circuit failure occurs. On the other hand, if no current I2a is measured, it is determined that a short circuit failure does not occur.

With the testing of wire WL1 completed, output signals are respectively shifted in the control circuit CC1a as shown in FIG. 6, to move the operation flow to testing of wire WL2. The short circuit failure testing operation of wires WL2 and WL3 is the same as that for wire WL1, and therefore further description thereof is hereby omitted.

As was described in the above text, the multi-chip module 1a according to the second embodiment has switches SW11 through SW13 for connecting the internal connection terminals IT11 through IT13 to the external connection terminal OT1, and transistors M11b through M13b for supplying a ground potential VSS to the internal connection terminals IT11 through IT13. A power source potential VDD can thus be supplied to the wires to be tested and a ground potential VSS can be supplied to the wires which are not to be tested, by switches SW11 through SW13 and transistors M11b through M13b provided in the first semiconductor device 10a. A difference in potential thus occurs between the wires to be tested and the rest of the wires, thereby allowing to test the presence or absence of a short circuit failure in each of the wires WL1 through WL3.

In the multi-chip module 1a according to the disclosure, the first semiconductor device 10a is provided with circuits (switches SW11 through SW13, transistors M11b through M13b and the like) required for short circuit failure testing, which thus eliminates the need to provide switch elements and the like for testing in the second semiconductor device 20a to which the first semiconductor device 10a is connected. The short circuit failure testing can thus be carried out irrespective of whether the device to which connection is made is provided with switch elements for testing, which allows for a higher degree of freedom in short circuit failure testing. Since it is sufficient to provide circuits for short circuit failure testing in the first semiconductor device 10a alone, the overall circuit size of the multi-chip module 1a can be reduced.

Measuring of the current value of the current I2a allows to measure a resistance value showing the extent of the short circuit failure. As a result, such failures can be detected even in the event a short circuit failure occurs in the extent that a low resistance state exists but signal propagation is still possible. This allows for testing of semiconductor modules requiring high reliability.

The disclosure is not limited to the above-described embodiments, and needless to say, various alterations and modifications are possible without departing from the spirit of the disclosure. Although a description was given that the second semiconductor device 20 according to the first embodiment has a transistor M22 that supplies a ground potential VSS to the internal connection terminal IT22, it is not limited to this. Needless to say, the second semiconductor device 20 may also be configured to further include a transistor M32 that supplies a power source potential VDD to the internal connection terminal IT22, as was described with respect to the second semiconductor device 20b shown in FIG. 7. A signal pu22 is inputted from the flip flop FF22b to the gate of transistor M32. The remaining configuration is the same as that of the second semiconductor device 20 according to the first embodiment, and therefore, further description thereof is hereby omitted.

Next, the open circuit failure testing of wire WL2 will be described. A ground potential VSS is supplied to the test terminal TT from an external measuring device not shown. A signal test2=ON is outputted by the flip flop FF12 provided in the control circuit CC1, so that the switch SW12 is made conductive and the internal connection terminal IT12 is connected to the external connection terminal OT1. Also, signals pu22=ON and pd22=OFF are outputted from the flip flop FF22b provided in the control circuit CC2b, so that the transistor M32 is made conductive, transistor M22 is made non-conductive and a power source potential VDD is supplied to the internal connection terminal IT22. Thus, as shown in FIG. 7, a current path is formed extending from the power source potential VDD, through the transistor M32, the internal connection terminal IT22, the wire WL2, the internal connection terminal IT12, the switch SW12, the external connection terminal OT1, the wire WL0 and to the test terminal TT. If no open circuit failure occurs, a current I2b flowing from the transistor M32 to the test terminal TT is generated. The measuring device which is not shown compares the current value of current I2b to a threshold current value to determine the presence or absence of an open circuit failure.

In the second semiconductor device 20b, both a power source potential VDD and a ground potential VSS can be supplied to the internal connection terminal IT22. Thus, the direction of the current flowing to wire WL2 to be tested can be decided at random. As shown in FIG. 7, the direction of the signal (from buffer B22 to buffer B12) can be made to coincide with the direction of the current I2b, which allows for open circuit failure testing which is even closer to real practical conditions, thereby improving the testing accuracy. By providing a diode or the like on the current path, for instance, open circuit failure testing can be carried out in the current path where the current direction is set to one predetermined direction. Needless to say, the direction of the current flowing through the wires can be set randomly for short circuit failure testing as well, thereby improving testing accuracy.

Figure 8:
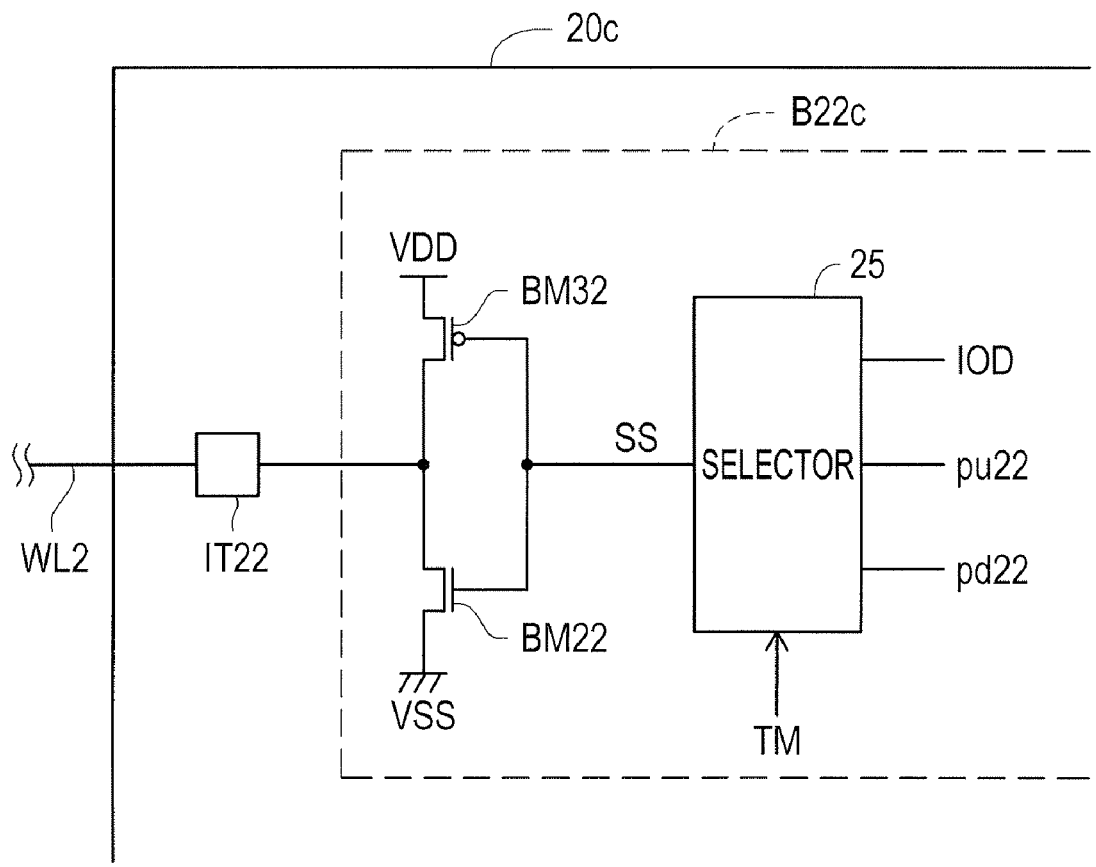
FIG. 8 is a diagram showing a circuit configuration of a second semiconductor device 20c.
Figure 9:
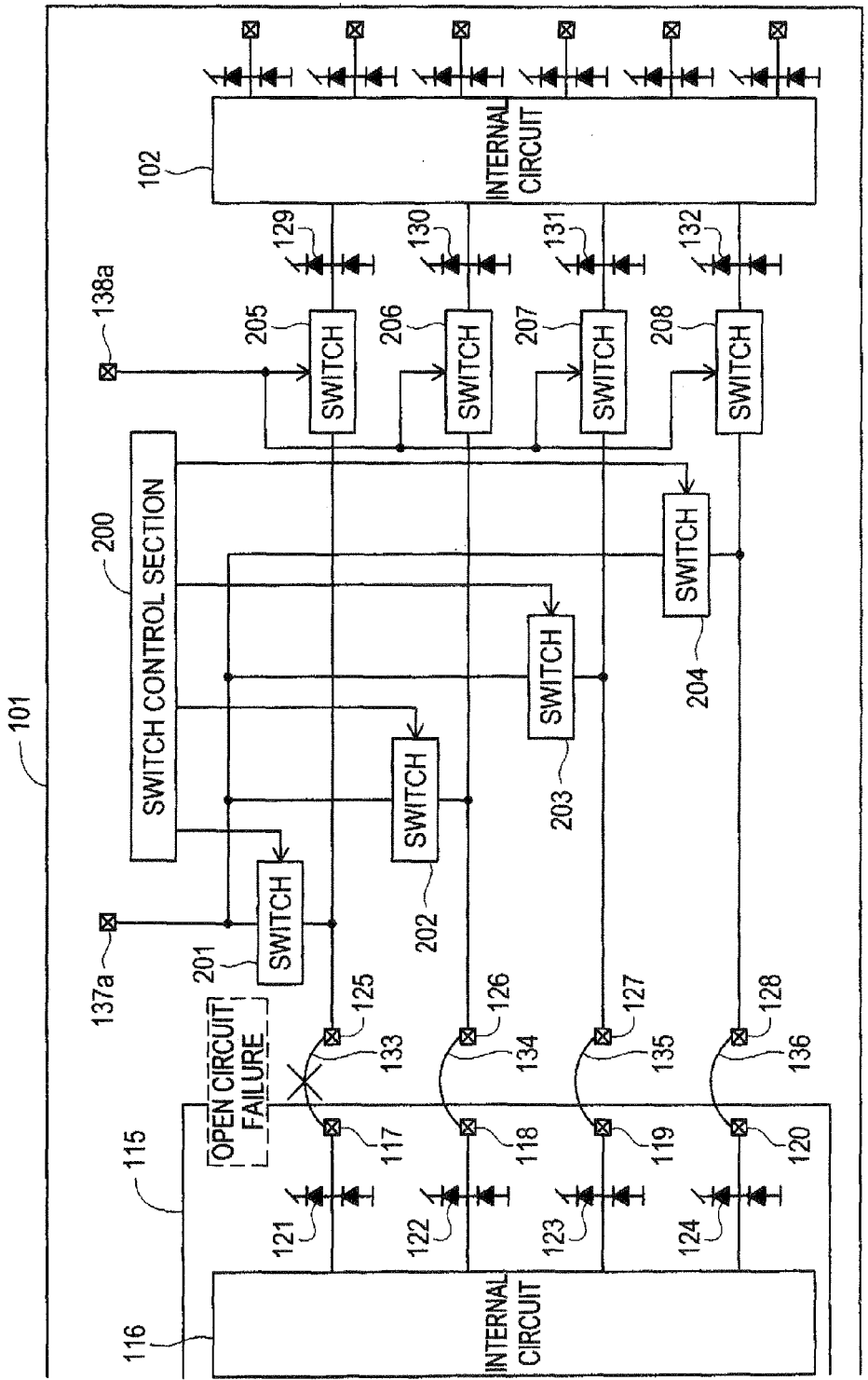
FIG. 9 is a block circuit diagram showing a configuration of a conventional semiconductor device.

As shown in FIG. 7, a description was given that the second semiconductor device 20b is provided with an additional transistor M22 and a transistor M32 serving as failure testing transistors, but it is not limited to this. As shown in FIG. 8, the second semiconductor device 20c may also employ an output transistor as a failure testing transistor. The buffer B22c provided in the second semiconductor device 20c has output transistors BM22 and BM32 and a selector 25. Selector 25 receives input/output signal IOD, signals pu22 and pd22 from the second semiconductor device 20c. The selector 25 also receives a testing mode signal TM from an internal circuit not shown provided in the second semiconductor device 20c. A signal SS outputted from the selector 25 is inputted to the gate of output transistors BM22 and BM32.

Selector 25 recognizes a non-testing mode and an open/short circuit failure testing mode in response to a testing mode signal TM. Upon receiving a testing mode signal TM indicating a non-testing mode, selector 25 selects an input/output signal IOD and outputs the result as a signal SS and operation in the second semiconductor device 20c is carried out normally. On the other hand, upon receiving a testing mode signal TM indicating an open/short circuit failure testing mode, selector 25 selects signal pu22 or pd22 and outputs the result as signal SS. If a ground potential VSS is supplied to internal connection terminal IT22, selector 25 outputs a high level signal pd22, so that the transistor BM22 is made conductive and the transistor BM32 is made non-conductive. On the other hand, if a power source potential VDD is supplied to the internal connection terminal IT22, the selector 25 outputs a low level signal pu22, so that the output transistor BM22 is made non-conductive and transistor BM32 is made conductive.

As a result, by employing an output transistor as a failure testing transistor, one potential from the power source potential VDD and the ground potential VSS can be selectively supplied to the internal connection terminal IT22. Since a large-sized transistor is used as an output transistor to make its conduction resistance smaller, the resistance value showing the extent of the open/short circuit failure can be more accurately measured by using the above output transistor during open/short circuit failure testing. Since a large-sized output transistor can be shared between the non-testing mode and the open/short circuit failure testing mode, the circuit size of the second semiconductor device 20c can be reduced.

In the present embodiment a description was given on open/short circuit failure testing with respect to the connection between two semiconductor devices, however, the number of semiconductor devices to be connected is not limited to two. It is needless to say testing can also be performed with respect to connection among three or more semiconductor devices. In this case, open/short circuit failure testing may be carried out sequentially by testing in turn each wire connecting the three or more semiconductor devices to each other.

A description was given that the second semiconductor device 20 has a control circuit CC2, however, it is not limited to this. The second semiconductor device 20 may also be configured so that the control circuit CC1 outputs signals pd21 through pd23 and signals dr21 through dr23. As a result, the circuit configuration of the second semiconductor device 20 can be simplified.

Also, a description was given that the wires included three wires WL1 through WL3, however, it is not limited to this. According to the principle of the disclosure, in the open circuit failure testing operation, different potentials are supplied to one end and the other end of the wires to be tested, while in short circuit failure testing operation, different potentials are supplied to wires to be tested and wires which are not to be tested. Accordingly, needless to say, the principle of the disclosure can be applied even in case four or more wires are provided.

The internal connection terminals IT11 through IT13 are one example of first semiconductor device internal connection terminals, the power source potential VDD is one example of external supply potential, switches SW11 through SW13 are one example of first connection switches, the internal connection terminals IT21 through IT23 are one example of second semiconductor device internal connection terminals, the ground potential VSS is one example of a reference potential, transistors M21 through M23 are one example of second connection switches, transistor M32 is one example of a high-level connection switch, transistor M22 is one example of a low-level connection switch, control circuit CC1 is one example of a first control circuit, control circuit CC2 is one example of a second control circuit and selector 25 is one example of a selector circuit, respectively.

The disclosure has been worked out to solve at least one of the problems in the background art, and an object thereof is to provide a semiconductor module and a semiconductor device enabling more accurate testing of a connection state of the internal wiring in a semiconductor module in which a plurality of semiconductor devices are mounted, and between the semiconductor devices mounted in the semiconductor device module.

According to the semiconductor module and the semiconductor device of the disclosure, the connection state of the internal wiring between the semiconductor devices can be more accurately tested, thereby further enhancing the reliability of the semiconductor module.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor module comprising a plurality of semiconductor devices, the semiconductor module selecting a first semiconductor device and a second semiconductor device connected to each other by internal wires from the plurality of the semiconductor devices mounted therein and testing a connection state of the internal wires,
    wherein the first semiconductor device comprises:
    first semiconductor device internal connection terminals which are connected to the second semiconductor device through the internal wires;
    an external connection terminal which is connected to a terminal of the semiconductor module and is supplied with an external supply potential; and
    first connection switches which connect to-be-tested first semiconductor device internal connection terminals, selected from the first semiconductor device internal connection terminals, and the external connection terminal,
    the second semiconductor device comprises:
    second semiconductor device internal connection terminals which are connected to the first semiconductor device through the internal wires; and
    second connection switches which supply a reference potential to to-be-tested second semiconductor device internal connection terminals connected to the to-be-tested first semiconductor device internal connection terminals through the internal wires when in a first state, and supply the reference potential to the second semiconductor device internal connection terminals other than the to-be-tested second semiconductor device internal connection terminals when in a second state.

2. The semiconductor module according to claim 1, wherein the second connection switches comprises:
    high-level connection switches which connect internal connection terminals to a high-level reference potential; and
    low-level connection switches which connect the internal connection terminals to a low-level reference potential.

3. The semiconductor module according to claim 1, wherein the first connection switches are provided corresponding to each of the first semiconductor device internal connection terminals, and
    the first semiconductor device comprises a first control circuit which sequentially selects and brings the first connection switches into conduction.

4. The semiconductor module according to claim 1, wherein the second connection switches are provided corresponding to each of the second semiconductor device internal connection terminals, and
    the second semiconductor device comprises a second control circuit which brings into conduction the second connection switches connected to the second semiconductor device internal connection terminals connected to to-be-tested internal connection terminals through the internal wires when in the first state, and brings into conduction the second connections switches connected to all the second semiconductor device internal connection terminals other than the second semiconductor device internal terminals connected to the to-be-tested internal connection terminals through the internal wires when in the second state.

5. The semiconductor module according to claim 4, wherein the second connection switches are output transistors connected to each of the second semiconductor device internal connection terminals, and
    the second semiconductor device comprises a selector circuit in which an output from the second control circuit and an output from an internal circuit of the second semiconductor device are inputted thereto and an output from there is inputted to the output transistors.

6. The semiconductor module according to claim 3, wherein the first control circuit sets all of output buffers connected to the first semiconductor device internal connection terminals to a high impedance state.

7. The semiconductor module according to claim 4, wherein the second control circuit sets all of output buffers connected to the second semiconductor device internal connection terminals to a high impedance state.

8. A semiconductor device used by a semiconductor module in which a plurality of semiconductor devices are mounted, the semiconductor device comprising:
    an external connection terminal which is connected to terminals of the semiconductor module and supplied with an external supply potential;
    internal connection terminals which are connected to other one of the plurality of the semiconductor devices mounted in the semiconductor module through internal wires;
    first connection switches which connect to-be-tested internal connection terminals, selected from the internal connection terminals, and the external connection terminal; and third connection switches which supply a reference potential to the internal connection terminals other than the to-be-tested internal connection terminals.

9. The semiconductor device according to claim 8, wherein the third connection switches comprises:
   high-level connection switches which connect the internal connection terminals to a high-level reference potential; and
   low-level connection switches which connect the internal connection terminals to a low-level reference potential.

10. The semiconductor device according to claim 8,
    wherein the first connection switches are provided corresponding to each of the internal connection terminals, and
    the semiconductor device further comprises a first control circuit which sequentially selects and brings the first connection switches into conduction.

11. The semiconductor device according to claim 10,
    wherein the third connection switches are output transistors connected to each of the internal connection terminals, and
    the semiconductor device further comprises a selector circuit in which an output from the first control circuit and an output from an internal circuit of the semiconductor device are inputted thereto and an output from there is inputted to the output transistors.

12. The semiconductor device according to claim 10,
    wherein the first control circuit sets all of output buffers connected to the internal connection terminals to a high impedance state.

13. A testing method of a semiconductor module which comprises a plurality of semiconductors being mounted therein, selects a first semiconductor device and a second semiconductor device connected to each other by internal wires from the plurality of semiconductor devices mounted in the semiconductor module and tests a connection state of the internal wires,
    the first semiconductor device comprising first semiconductor device internal connection terminals which are connected to the second semiconductor device through the internal wires, and an external connection terminal which is connected to a terminal of the semiconductor module and is supplied with an external supply potential,
    the second semiconductor device comprising second semiconductor device internal connection terminals which are connected to the first semiconductor device through the internal wires,
    the testing method of the semiconductor module comprising:
    connecting to-be-tested first semiconductor device internal connection terminals selected from the first semiconductor device internal connection terminals and the external connection terminal; and
    supplying a reference potential to to-be-tested second semiconductor device internal connection terminals connected to the to-be-tested first semiconductor device internal connection terminals through the internal wires when in a first state, and supplying the reference potential to the second semiconductor device internal connection terminals other than the to-be-tested second semiconductor device internal connection terminals when in a second state.

14. A testing method of a semiconductor device used by a semiconductor module in which a plurality of semiconductor devices are mounted,
    the semiconductor device comprising an external connection terminal which is connected to terminals of the semiconductor module and supplied with an external supply potential, and internal connection terminals which are connected to other one of the plurality of the semiconductor devices mounted in the semiconductor module through internal wires,
    the testing method of the semiconductor device comprising:
    connecting to-be-tested internal connection terminals selected from the internal connection terminals and the external connection terminal; and
    supplying a reference potential to the internal connection terminals other than the to-be-tested internal connection terminals.

* * * * *

UNITED STATES PATENT AND TRADEMARK OFFICE
CERTIFICATE OF CORRECTION

| | | |
|---|---|---|
| PATENT NO. | : 7,859,284 B2 | Page 1 of 1 |
| APPLICATION NO. | : 12/058241 | |
| DATED | : December 28, 2010 | |
| INVENTOR(S) | : Shinichiro Ikeda | |

It is certified that error appears in the above-identified patent and that said Letters Patent is hereby corrected as shown below:

On the Title Page:

Insert item --(30)   March 29, 2007 (JP).................2007-088453--

Signed and Sealed this
Fourteenth Day of February, 2012

David J. Kappos
*Director of the United States Patent and Trademark Office*